United States Patent [19]
Kuo et al.

[11] Patent Number: 5,981,347
[45] Date of Patent: Nov. 9, 1999

[54] MULTIPLE THERMAL ANNEALING METHOD FOR A METAL OXIDE SEMICONDUCTOR FIELD EFFECT TRANSISTOR WITH ENHANCED HOT CARRIER EFFECT (HCE) RESISTANCE

[75] Inventors: So-Wen Kuo; Lin-June Wu; Li-Huan Chu, all of Hsin-Chu, Taiwan

[73] Assignee: Taiwan Semiconductor Manufacturing Company, Ltd., Hsin-Chu, Taiwan

[21] Appl. No.: 08/949,946

[22] Filed: Oct. 14, 1997

[51] Int. Cl.$^6$ .................................................. H01L 21/336
[52] U.S. Cl. ............................................. 438/308; 438/530
[58] Field of Search .................................. 438/305, 306, 438/307, 308, 530, 795

[56] References Cited

U.S. PATENT DOCUMENTS

| | | | |
|---|---|---|---|
| 4,151,008 | 4/1979 | Kirkpatrick | 438/530 |
| 5,389,809 | 2/1995 | Haken et al. | 257/344 |
| 5,413,968 | 5/1995 | Inoue et al. | 437/200 |
| 5,491,099 | 2/1996 | Hsu | 437/35 |
| 5,510,296 | 4/1996 | Yen et al. | 437/200 |
| 5,837,572 | 11/1998 | Gardner et al. | 438/530 |
| 5,874,344 | 2/1999 | Thompson et al. | 438/308 |
| 5,877,050 | 3/1999 | Gardner et al. | 438/308 |

Primary Examiner—Chandra Chaudhari
Attorney, Agent, or Firm—George O. Saile; Stephen B. Ackerman; Alek P. Szecsy

[57] ABSTRACT

A method for forming a metal oxide semiconductor field effect transistor (MOSFET). There is first provided a semiconductor substrate. There is then formed upon the semiconductor substrate a gate dielectric layer. There is then formed upon the gate dielectric layer a gate electrode. There is then implanted into the semiconductor substrate while employing the gate electrode as a mask a pair of unactivated source/drain regions at a pair of opposite edges of the gate electrode, where the gate dielectric layer, the gate electrode and the pair of unactivated source/drain regions form an unactivated metal oxide semiconductor field effect transistor (MOSFET). There is then annealed thermally through a first thermal annealing method the semiconductor substrate to form from the pair of unactivated source/drain regions a pair of activated source/drain regions, where the gate dielectric layer, the gate electrode and the pair of activated source/drain regions form an activated metal oxide semiconductor field effect transistor (MOSFET). Finally, there is then annealed thermally through a subsequent second thermal annealing method the semiconductor substrate to form from the activated metal oxide semiconductor field effect transistor (MOSFET) a hot carrier effect (HCE) resistant activated metal oxide semiconductor field effect transistor (MOSFET).

5 Claims, 2 Drawing Sheets

MULTIPLE THERMAL ANNEALING METHOD FOR A METAL OXIDE SEMICONDUCTOR FIELD EFFECT TRANSISTOR WITH ENHANCED HOT CARRIER EFFECT (HCE) RESISTANCE

BACKGROUND OF THE INVENTION

1. Field of the Invention

The present invention relates generally to hot carrier effects (HCEs) within metal oxide semiconductor field effect transistors (MOSFETs). More particularly, the present invention relates to methods for attenuating hot carrier effects (HCEs) within metal oxide semiconductor field effect transistors (MOSFETs).

2. Description of the Related Art

As integrated circuit integration levels have increased and integrated circuit device and conductor element dimensions have decreased, various novel effects have become more pronounced within advanced integrated circuit microelectronics fabrications. Within advanced integrated circuit microelectronics fabrications which have fabricated therein metal oxide semiconductor field effect transistors (MOSFETs), a particularly common and generally detrimental effect incident to forming those metal oxide semiconductor field effect transistors (MOSFETs) with decreased dimensions is the hot carrier effect (HCE).

The hot carrier effect (HCE) derives from injection of charge carriers into gate dielectric layers typically formed of silicon oxide formed beneath gate electrode edges within advanced metal oxide semiconductor field effect transistors (MOSFETs). The injection of the charge carriers results from decreased channel widths and decreased gate dielectric layer thicknesses within advanced metal oxide semiconductor field effect transistors (MOSFETs) while maintaining constant advanced metal oxide semiconductor field effect transistor (MOSFET) operating voltage. The decreased channel widths and decreased gate dielectric layer thicknesses within advanced metal oxide semiconductor field effect transistors (MOSFETs) at constant metal oxide semiconductor field effect transistor (MOSFET) operating voltage typically provide increased electrical field gradients at gate electrode edges within advanced metal oxide semiconductor field effect transistors (MOSFETs), through which increased electrical field gradients charge carriers are injected into gate dielectric layers.

Along with other characteristics, the hot carrier effect (HCE) within an advanced metal oxide semiconductor field effect transistor (MOSFET) is typically manifested as: (1) an increased sub-threshold current within the metal oxide semiconductor field effect transistor (MOSFET); and (2) a drift in threshold voltage within the metal oxide semiconductor field effect transistor (MOSFET). Hot carrier effect (HCE) damage sustained by a metal oxide semiconductor field effect transistor (MOSFET) is often cumulative and typically results in premature metal oxide semiconductor field effect transistor (MOSFET) failure. Since inhomogeneous electrical properties within metal oxide semiconductor field effect transistors (MOSFETs) and premature failure of metal oxide semiconductor field effect transistors (MOSFETs) are undesirable within advanced metal oxide semiconductor field effect transistor (MOSFET) operation, it is thus towards the goal of attenuating hot carrier effects (HCEs) within advanced metal oxide semiconductor field effect transistors (MOSFETs) that the present invention is generally directed.

Various methods have been disclosed in the art of integrated circuit microelectronics fabrication for controlling hot carrier effects (HCEs) within metal oxide semiconductor field effect transistors (MOSFETs). In addition, there has also been disclosed in the art of integrated circuit microelectronics fabrication various methods for forming contact layers upon source/drain electrodes within metal oxide semiconductor field effect transistors (MOSFETs) of line width dimensions which may be susceptible to hot carrier effects (HCEs).

For example, Haken et al., in U.S. Pat. No. 5,389,809 disclose a dual ion implant method for forming a pair of source/drain regions within a metal oxide semiconductor field effect transistors (MOSFET) to provide the metal oxide semiconductor field effect transistor (MOSFET) with enhanced hot carrier effect (HCE) resistance. The dual ion implant method employs two separate dopants of differing diffusivity within the pair of source/drain regions of the metal oxide semiconductor field effect transistor (MOSFET), such that upon thermal annealing of the metal oxide semiconductor field effect transistor (MOSFET) there is formed within the pair of source/drain regions dopant concentration gradients at the gate electrode edges.

In addition, Hsu, in U.S. Pat. No. 5,491,099 discloses a method for fabricating a silicided lightly doped drain (LDD) within a metal oxide semiconductor field effect transistor (MOSFET) to provide the metal oxide semiconductor field effect transistor (MOSFET) with enhanced hot carrier effect (HCE) resistance. The method recesses a lightly doped drain (LDD) low dose ion implant structure of the metal oxide semiconductor field effect transistor (MOSFET) within a semiconductor substrate within and upon which is formed the metal oxide semiconductor field effect transistor (MOSFET) to simultaneously form the metal oxide semiconductor field effect transistor (MOSFET) with enhanced hot carrier effect (HCE) resistance and decreased channel length.

Further, Inoue et al., in U.S. Pat. No. 5,413,968 discloses a method for forming within an integrated circuit microelectronics fabrication a metal silicide interconnect layer contacting a source/drain region of a metal oxide semiconductor field effect transistor (MOSFET) formed within and upon a semiconductor substrate within the integrated circuit microelectronics fabrication. The method employs a barrier layer formed upon the source/drain region and beneath a polysilicon layer which is subsequently completely consumed when forming the metal silicide interconnect layer through thermal annealing with a metal layer overlying the polysilicon layer. Through the method there is avoided consumption of silicon from the semiconductor substrate when thermally annealing the polysilicon layer and the metal layer to form the metal silicide interconnect layer.

Finally, Yen et al., in U.S. Pat. No. 5,510,296 discloses a method for forming within an integrated circuit microelectronics fabrication a tungsten silicide polycide contact layer contacting a source/drain region within a metal oxide semiconductor field effect transistor (MOSFET). The method employs an amorphous silicon underlayer formed upon the source/drain region and a chemical vapor deposited (CVD) tungsten silicide layer formed thereupon, where the tungsten silicide layer and the amorphous silicon underlayer are simultaneously annealed within a nitrogen containing atmosphere to form the tungsten silicide polycide contact layer contacting the source/drain region.

Desirable in the art of integrated circuit microelectronics fabrication are additional methods and materials through which there may be formed metal oxide semiconductor field effect transistors (MOSFETs) which have enhanced hot carrier (HCE) resistance. It is towards that goal that the present invention is directed.

SUMMARY OF THE INVENTION

A first object of the present invention is to provide a method for forming within an integrated circuit microelectronics fabrication a metal oxide semiconductor field effect transistor (MOSFET) with enhanced hot carrier effect (HCE) resistance.

A second object of the present invention is to provide a method in accord with the first object of the present invention, which method is readily manufacturable.

In accord with the objects of the present invention, there is provided by the present invention a method for forming within an integrated circuit microelectronics fabrication a metal oxide semiconductor field effect transistor with enhanced hot carrier effect (HCE) resistance. To practice the method of the present invention, there is first provided a semiconductor substrate. There is then formed upon the semiconductor substrate a gate dielectric layer. There is then formed upon the gate dielectric layer a gate electrode. There is then implanted into the semiconductor substrate while employing the gate electrode as a mask a pair of unactivated source/drain regions at a pair of opposite edges of the gate electrode, where the gate dielectric layer, the gate electrode and the pair of unactivated source/drain regions form an unactivated metal oxide semiconductor field effect transistor (MOSFET). There is then annealed thermally through a first thermal annealing method the semiconductor substrate to form from the pair of unactivated source/drain regions a pair of activated source/drain regions, where the gate dielectric layer, the gate electrode and the pair of activated source/drain regions form an activated metal oxide semiconductor field effect transistor (MOSFET). Finally, there is annealed thermally through a subsequent second thermal annealing method the semiconductor substrate to form from the activated metal oxide semiconductor field effect transistor (MOSFET) a hot carrier effect (HCE) resistant activated metal oxide semiconductor field effect transistor (MOSFET).

The present invention provides a method for forming within an integrated circuit microelectronics fabrication a metal oxide semiconductor field effect transistor (MOSFET) with enhanced hot carrier effect (HCE) resistance. The method of the present invention realizes this object by employing a two step thermal annealing method in forming the hot carrier effect (HCE) resistant metal oxide semiconductor field effect transistor (MOSFET), where: (1) the first step within the two step thermal annealing method employs a first thermal annealing method to activate a pair of unactivated source/drain regions within an unactivated metal oxide semiconductor field effect transistor (MOSFET) and form therefrom an activated metal oxide semiconductor field effect transistor (MOSFET); and (2) the second step within the two step thermal annealing method employs a subsequent second thermal annealing method to form from the activated metal oxide semiconductor field effect transistor (MOSFET) a hot carrier effect (HCE) resistant activated metal oxide semiconductor field effect transistor (MOSFET). While the mechanism through which the second thermal annealing method within the two step thermal annealing method of the present invention provides within the method of the present invention the hot carrier effect resistant activated metal oxide semiconductor field effect transistor (MOSFET) is not entirely clear, it is nonetheless clear that upon thermal annealing the activated metal oxide semiconductor field effect transistor (MOSFET) through the second thermal annealing method in accord with the method of the present invention there is formed from the activated metal oxide semiconductor field effect transistor (MOSFET) the hot carrier effect (HCE) resistant activated metal oxide semiconductor field effect transistor (MOSFET).

The method of the present invention is readily manufacturable. The method of the present invention employs a two step thermal annealing method to form from an unactivated metal oxide semiconductor field effect transistor (MOSFET) a hot carrier effect (HCE) resistant activated metal oxide semiconductor field effect transistor (MOSFET). Since thermal annealing methods, including multi-step thermal annealing methods, are generally known in the art of integrated circuit microelectronics fabrication, the method of the present invention is readily manufacturable.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this application, wherein.

DESCRIPTION OF THE PREFERRED EMBODIMENT

The present invention provides a method for forming within an integrated circuit microelectronics fabrication a hot carrier effect (HCE) resistant metal oxide semiconductor field effect transistor (MOSFET). The method of the present invention provides the hot carrier effect (HCE) resistant metal oxide semiconductor field effect transistor (MOSFET) through a two step thermal annealing method where: (1) in a first step of the two step thermal annealing method there is thermally annealed an unactivated metal oxide semiconductor field effect transistor (MOSFET) having a pair of unactivated source/drain regions formed therein to form an activated metal oxide semiconductor field effect transistor (MOSFET) having a pair of activated source/drain regions formed therein; and (2) in a second step of the two step thermal annealing method there is thermally annealed the activated metal oxide semiconductor field effect transistor (MOSFET) to form therefrom a hot carrier effect (HCE) resistant activated metal oxide semiconductor field effect transistor (MOSFET).

The method of the present invention may be employed when forming within integrated circuit microelectronics fabrications metal oxide semiconductor field effect transistors (MOSFETs) including but not limited to N-channel metal oxide semiconductor field effect transistors (N-MOSFETs) and P-channel metal oxide semiconductor field effect transistors (P-MOSFETs). Similarly, the method of the present invention may additionally be employed, without limit, when sequentially forming N-channel and P-channel metal oxide semiconductor field effect transistors (MOSFETs) within complementary metal oxide semiconductor (CMOS) integrated circuit microelectronics fabrications. In addition, the method of the present invention may similarly be employed, without limit, when forming metal oxide semiconductor field effect transistors (MOSFETs) within bipolar complementary metal oxide semiconductor (BiCMOS) integrated circuit microelectronics fabrications.

Figure 1:
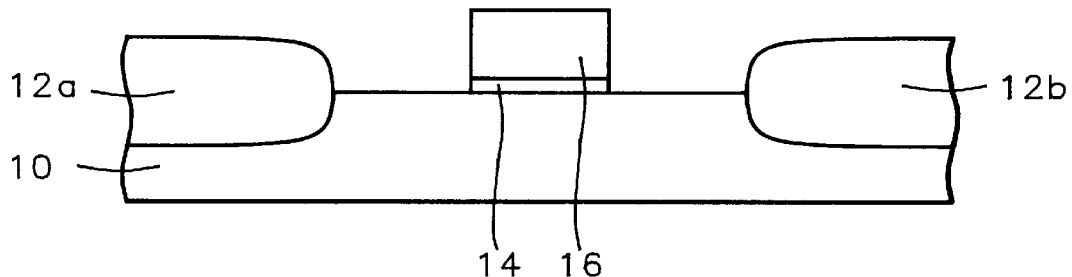
FIG. 1 to FIG. 5 show a series of schematic cross-sectional diagrams illustrating the results of progressive stages in forming within an integrated circuit microelectronics fabrication a hot carrier effect (HCE) resistant activated metal oxide semiconductor field effect transistor (MOSFET) in accord with the preferred embodiment of the present invention.

Referring now to FIG. 1 to FIG. 5, there is shown a series of schematic cross-sectional diagrams illustrating the results of progressive stages of forming within an integrated circuit microelectronics fabrication a hot carrier effect (HCE) resistant metal oxide semiconductor field effect transistor (MOSFET) in accord with a preferred embodiment of the present invention. Shown in FIG. 1 is a schematic cross-sectional diagram of the integrated circuit microelectronics fabrication at an early stage in its fabrication.

Shown in FIG. 1 is a semiconductor substrate 10 having formed within and upon its surface a pair of isolation regions 12a and 12b which define an active region of the semiconductor substrate 10. Although semiconductor substrates are known in the art of integrated circuit microelectronics fabrication with either dopant polarity, various dopant concentrations and several crystallographic orientations, for the preferred embodiment of the present invention the semiconductor substrate 10 is preferably a (100) silicon semiconductor substrate having an N- or P- doping.

Similarly, although it is also known in the art of integrated circuit microelectronics fabrication that isolation regions may be formed within and/or upon semiconductor substrates to define active regions of those semiconductor substrates through methods including but not limited to isolation region thermal growth methods and isolation region deposition/patterning methods, for the preferred embodiment of the present invention the isolation regions 12a and 12b are preferably formed within and upon the semiconductor substrate 10 to define the active region of the semiconductor substrate 10 through an isolation region thermal growth method at a temperature of from about 950 to about 1000 degrees centigrade, thus forming the isolation regions 12a and 12b of silicon oxide within and upon the semiconductor substrate 10.

Shown also within FIG. 1 formed within the active region of the semiconductor substrate 10 is a gate dielectric layer 14 having formed and aligned thereupon a gate electrode 16. Methods and materials through which gate dielectric layers and gate electrodes may be formed within metal oxide semiconductor field effect transistors (MOSFETs) within integrated circuit microelectronics fabrications are known in the art of integrated circuit microelectronics fabrication. For example, gate dielectric layers may be formed within metal oxide semiconductor field effect transistors (MOSFETs) within integrated circuit microelectronics fabrications through patterning, through methods as are conventional in the art, of blanket gate dielectric layers formed within those metal oxide semiconductor field effect transistors (MOSFETs). The blanket gate dielectric layers may be formed through methods including but not limited to blanket gate dielectric layer thermal growth methods and blanket gate dielectric layer deposition/patterning methods. For the preferred embodiment of the present invention, the gate dielectric layer 14 is preferably formed through patterning, through methods as are conventional in the art, of a blanket gate dielectric layer formed through a thermal oxidation method at a temperature of from about 750 to about 850 degrees centigrade to form the gate dielectric layer 14 of silicon oxide at a thickness of about 65 to about 75 angstroms upon the active region of the semiconductor substrate 10.

Similarly, methods and materials through which may be formed gate electrodes within metal oxide semiconductor field effect transistors (MOSFETs) within integrated circuit microelectronics fabrications are also known in the art of integrated circuit microelectronics fabrication. Gate electrodes may be formed within metal oxide semiconductor field effect transistors (MOSFETs) within integrated circuit microelectronics fabrications through patterning, through methods as are conventional in the art of integrated circuit microelectronics fabrication, of blanket layers of gate electrode materials formed from gate electrode materials including but not limited to metals, metal alloys, doped polysilicon and polycides (doped polysilicon/metal silicide stacks). For the preferred embodiment of the present invention, the gate electrode 16 is preferably formed and aligned upon the gate dielectric layer 14 through patterning of a blanket layer of a doped polysilicon or a polycide (such as a tungsten silicide polycide) gate electrode material layer to yield the gate electrode 16 of thickness about 2500 to about 3000 angstroms formed and aligned upon the gate dielectric layer 14.

Figure 2:
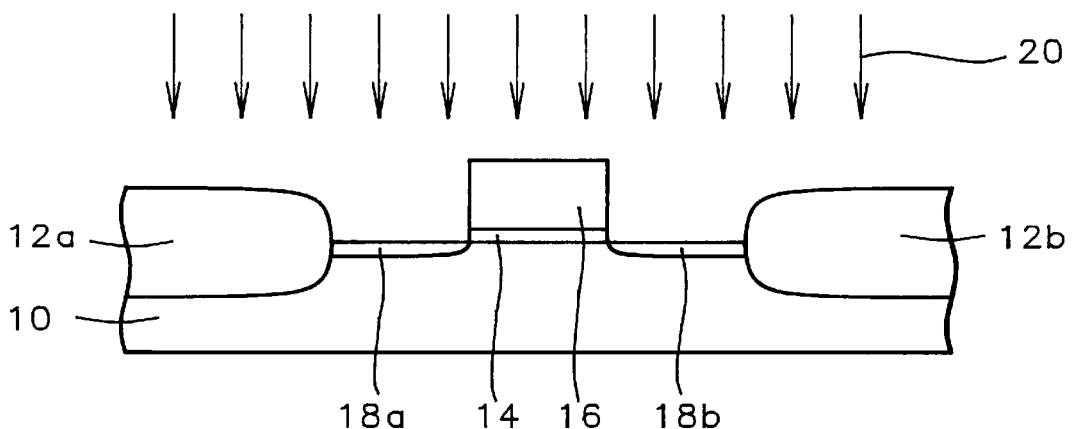

Referring now to FIG. 2, there is shown a schematic cross-sectional diagram illustrating the results of further processing of the integrated circuit microelectronics fabrication whose schematic cross-sectional diagram is illustrated in FIG. 1. Shown in FIG. 2 is a schematic cross-sectional diagram of an integrated circuit microelectronics fabrication otherwise equivalent to the integrated circuit microelectronics fabrication whose schematic cross-sectional diagram is illustrated in FIG. 1, but where there is formed within the active region of the semiconductor substrate 10 at areas not covered by the gate electrode 16 and the gate dielectric layer 14 a pair of low dose ion implants 18a and 18b through implanting those areas of the semiconductor substrate 10 with a dose of low dose implanting ions 20. The pair of low dose ion implants 18a and 18b, and the dose of low dose implanting ions 20 may be provided through methods and materials as are conventional in the art of integrated circuit microelectronics fabrication. Typically and preferably, the dose of low dose implanting ions 20 is provided at an ion implantation dose of from about 5E12 to about 6E12 ions per square centimeter and an ion implantation energy of from about 30 to about 40 keV. Dopant ions which are employed in forming the low dose ion implants 18a and 18b preferably include, but are not limited to, boron dopant ions, boron difluoride dopant ions, phosphorus dopant ions and arsenic dopant ions, as are similarly known in the art of integrated circuit microelectronics fabrication.

Figure 3:
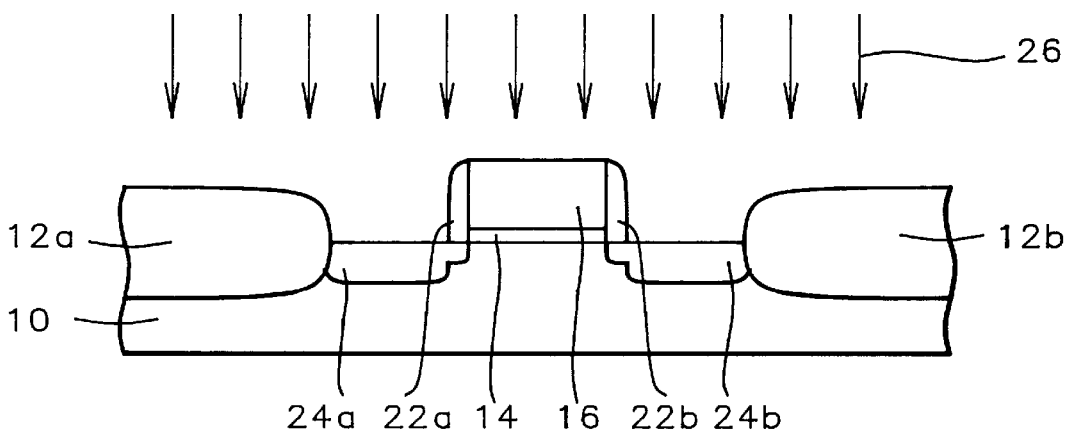

Referring now to FIG. 3, there is shown a schematic cross-sectional diagram illustrating the results of further processing of the integrated circuit microelectronics fabrication whose schematic cross-sectional diagram is illustrated in FIG. 2. Shown in FIG. 3 is a schematic cross-sectional diagram of an integrated circuit microelectronics fabrication otherwise equivalent to the integrated circuit microelectronics fabrication whose schematic cross-sectional diagram is illustrated in FIG. 2, but wherein there is formed adjacent a pair of opposite edges of the gate electrode 16 and the gate dielectric layer 14 a pair of dielectric spacer layers 22a and 22b. Methods and materials through which dielectric spacer layers may be formed within integrated circuit microelectronics fabrications are known in the art of integrated circuit microelectronics fabrication. Dielectric spacer layers are typically formed within integrated circuit microelectronics fabrication through anisotropic reactive ion etch (RIE) etching methods through which are formed dielectric spacers of dielectric materials including but not limited to silicon oxide dielectric materials, silicon nitride dielectric materials and silicon oxynitride dielectric materials. For the preferred embodiment of the present invention, the pair of dielectric spacer layers 22a and 22b is preferably formed through an anisotropic reactive ion etch (RIE) etching method to form the dielectric spacer layer 22a and 22b of silicon oxide, silicon nitride or silicon oxynitride extending for a width of from about 0.10 to about 0.13 microns from the pair of opposite edges of the gate dielectric layer 14 and the gate electrode 16, as illustrated in FIG. 3.

There is also shown in FIG. 3 a pair of unactivated source/drain regions 24a and 24b formed into the active region of the semiconductor substrate 10, where the pair of unactivated source/drain regions 24a and 24b incorporates the corresponding low dose ion implants 18a and 18b previously formed within the active region of the semiconductor substrate. Within the integrated circuit whose schematic cross-sectional diagram is illustrated in FIG. 3, the pair of unactivated source/drain regions 24a and 24b is formed through ion implanting with a dose of high dose implanting ions 26 while employing the gate dielectric layer 14, the gate electrode 16 and the pair of dielectric spacer layers 22a and 22b as a mask. Typically and preferably, the dose of high dose implanting ions 26 is provided at an ion implantation dose of from about 2E15 to about 5E15 ions per square centimeter and an ion implantation energy of from about 30 to about 50 keV. The polarity and choices of the high dose implanting ions 26 are typically and preferably equivalent to the polarity and choices of the low dose implanting ions 20 as illustrated within the schematic cross-sectional diagram of FIG. 2.

At this point in the fabrication of the integrated circuit microelectronics fabrication whose schematic cross-sectional diagram is illustrated in FIG. 3, the gate dielectric layer 14, the gate electrode 16 and the pair of unactivated source/drain regions 24a and 24b, at minimum, form within the integrated circuit microelectronics fabrication an unactivated metal oxide semiconductor field effect transistor (MOSFET). The unactivated source/drain regions 24a and 24b within the unactivated metal oxide semiconductor field effect transistor (MOSFET) are typically subsequently activated through thermal annealing under appropriate conditions which repair damage sustained by the semiconductor substrate 10 when implanting the dose of high dose implanting ions 26 and forming the unactivated source/drain regions 24a and 24b.

Figure 4:
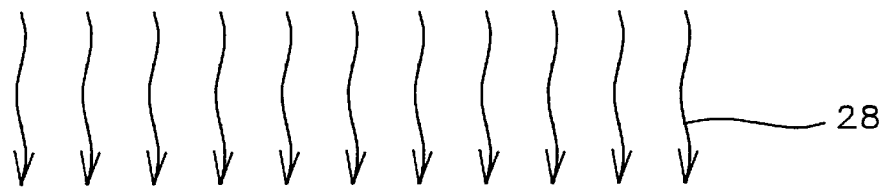
Figure 4:
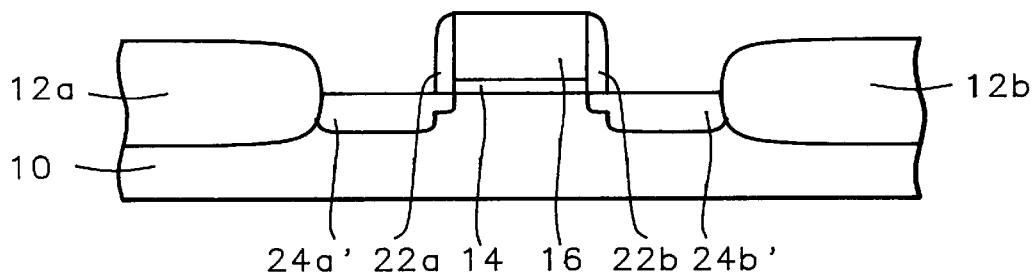

Referring now to FIG. 4, there is shown a schematic cross-sectional diagram illustrating the results of further processing of the integrated circuit microelectronics fabrication whose schematic cross-sectional diagram is illustrated in FIG. 3. Shown in FIG. 4 is a schematic cross-sectional diagram of an integrated circuit microelectronics fabrication otherwise equivalent to the integrated circuit microelectronics fabrication whose schematic cross-sectional diagram is illustrated in FIG. 3, but wherein the unactivated source/drain regions 24a and 24b have been activated to form the activated source/drain regions 24a' and 24b' through a first thermal annealing method employing a first thermal exposure 28.

Within the preferred embodiment of the present invention, it is desired to thermally anneal the semiconductor substrate 10 and form from the unactivated source/drain regions 24a and 24b the activated source/drain regions 24a' and 24b' typically in a fashion which provides for minimal thermal diffusion of the dopant ions within the unactivated source/drain regions 24a and 24b when forming the activated source/drain regions 24a' and 24b'. Thus, for the preferred embodiment of the present invention, the first thermal annealing method preferably employs the first thermal exposure 28 which is preferably provided by a rapid thermal annealing (RTA) first thermal exposure 28 reaching a first thermal annealing temperature of from about 900 to about 950 degrees centigrade within a ramping time period of from about 20 to about 30 seconds and maintaining the first annealing temperature of from about 900 to about 950 degrees centigrade for a first annealing time period of from about 30 to about 40 seconds. Preferably the first thermal annealing method is undertaken within a rapid thermal annealing (RTA) reactor chamber employing a nitrogen annealing gas ambient at: (1) a reactor chamber pressure of about 760 torr; and (2) an annealing ambient gas flow rate of from about 4000 to about 5000 standard cubic centimeters per minute (sccm).

Upon annealing within the first annealing method the unactivated source/drain regions 24a and 24b to form the activated source/drain regions 24a' and 24b', there is formed within the preferred embodiment of the method of the present invention from the gate dielectric layer 14, the gate electrode 16 and the pair of activated source/drain regions 24a' and 24b' an activated metal oxide semiconductor field effect transistor (MOSFET). Unfortunately, as illustrated within the examples which follow, the activated metal oxide semiconductor field effect transistor (MOSFET) also exhibits an enhanced hot carrier effect (HCE) susceptibility.

Figure 5:
Figure 5:
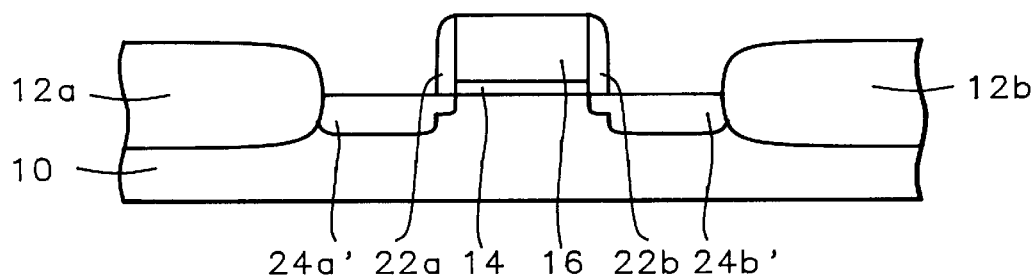

Referring now to FIG. 5, there is shown a schematic cross-sectional diagram illustrating the results of further processing of the integrated circuit microelectronics fabrication whose schematic cross-sectional diagram is illustrated in FIG. 4. Shown in FIG. 5 is a schematic cross-sectional diagram of an integrated circuit microelectronics fabrication otherwise equivalent to the integrated circuit microelectronics fabrication whose schematic cross-sectional diagram is illustrated in FIG. 4, but wherein the integrated circuit microelectronics fabrication is additionally thermally annealed through a subsequent second thermal annealing method employing a second thermal exposure 30. Within the method of the present invention, the activated metal oxide semiconductor field effect transistor (MOSFET) as illustrated within the schematic cross-sectional diagram of FIG. 4 when thermally annealed through the second thermal annealing method employing the second thermal exposure 30 as illustrated within the schematic cross-sectional diagram of FIG. 5 is transformed from the activated metal oxide semiconductor field effect transistor to a hot carrier effect (HCE) resistant activated metal oxide semiconductor field effect transistor (MOSFET).

Within the preferred embodiment of the present invention, the second thermal annealing method employing the second thermal exposure 30 is preferably undertaken at a thermal annealing temperature, a thermal annealing exposure time and within a thermal annealing ambient which: (1) optimally attenuates hot carrier effects (HCEs) within the activated metal oxide semiconductor field effect transistor (MOSFET) whose schematic cross-sectional diagram is illustrated in FIG. 4 while simultaneously also; (2) minimizes thermal exposure of the activated metal oxide semiconductor field effect transistor (MOSFET) to provide limited diffusion of the activated source/drain regions 24a' and 24b' . Within the preferred embodiment of the present invention it has been found experimentally that such thermal annealing temperatures, thermal annealing exposure times and thermal annealing ambients are preferably provided within a conventional annealing furnace employing: (1) an annealing furnace pressure of about 760 torr; (2) a second thermal annealing temperature of from about 750 to about 850 degrees centigrade; (3) a second thermal annealing exposure time of from about 50 to about 60 minutes; and (4) a nitrogen second thermal annealing ambient at a flow rate of from about 10 to about 20 standard cubic centimeters per minute (sccm).

Upon thermal annealing through the second thermal annealing method employing the second thermal exposure 30 the integrated circuit microelectronics fabrication whose schematic cross-sectional diagram is illustrated in FIG. 4 to form the integrated circuit microelectronics fabrication whose schematic cross-sectional diagram is illustrated in FIG. 5, there is formed an integrated circuit microelectronics fabrication having formed therein the hot carrier effect (HCE) resistant activated metal oxide semiconductor field effect transistor (MOSFET) of the preferred embodiment of the present invention. The hot carrier effect (HCE) resistant activated metal oxide semiconductor field effect transistor (MOSFET) so formed is preferably formed with minimal diffusion of the activated source/drain regions 24a' and 24b' within the hot carrier effect (HCE) resistant activated metal oxide semiconductor field effect transistor (MOSFET).

EXAMPLES

In order to demonstrate viability of the two step thermal annealing method of the present invention in forming a hot carrier effect (HCE) resistant activated metal oxide semiconductor field effect transistor (MOSFET), there was fabricated upon each of three semiconductor substrates a series of unactivated metal oxide semiconductor field effect transistors (MOSFETs) generally in accord with the preferred embodiment of the present invention as illustrated in FIG. 3. The three series of unactivated metal oxide semiconductor field effect transistors (MOSFETs) were fabricated employing P- silicon semiconductor substrates having a (100) crystallographic orientation. The unactivated metal oxide semiconductor field effect transistors (MOSFETs) each had a gate dielectric layer of silicon oxide of thickness about 70 angstroms formed through thermal oxidation of the semiconductor substrate at a temperature of from about 800 degrees centigrade.

Formed and aligned upon the gate dielectric layers of silicon oxide were gate electrodes formed of a tungsten silicide polycide employing: (1) a polysilicon layer of thickness about 1500 angstroms formed upon the gate dielectric layer; and (2) a tungsten silicide layer of thickness about 1250 angstroms formed upon the polysilicon layer.

Finally there was formed into the active region of the semiconductor substrate at a pair of opposite edges of the gate electrode and the gate dielectric layer a pair of unactivated source/drain regions through a high dose ion implantation method. The pair of unactivated source/drain regions were formed through the high dose ion implantation method at an ion implantation dose of about 5E15 phosphorus dopant ions per square centimeter and at an ion implantation energy of about 30 keV.

Each series of unactivated metal oxide semiconductor field effect transistors (MOSFETs) formed upon the three semiconductor substrates was then exposed to a first thermal annealing method to form therefrom a corresponding series of activated metal oxide semiconductor field effect transistors (MOSFETs). The first thermal annealing method was a rapid thermal annealing (RTA) method providing a first thermal annealing temperature of about 925 degrees centigrade within first thermal annealing ramp time of about 30 second and maintaining the first thermal annealing temperature of about 925 degrees centigrade for a first thermal annealing time period of about 30 seconds. The first thermal annealing method was undertaken within a rapid thermal annealing (RTA) reactor chamber which also employed: (1) a reactor chamber pressure of about 800 torr; and (2) a nitrogen thermal annealing ambient at a flow rate of from about 4000 to about 5000 standard cubic centimeters per minute (sccm).

Each series of activated metal oxide semiconductor field effect transistors (MOSFETs) upon the three semiconductor substrates was then exposed to a second thermal annealing method designed to assist in determining a temperature range within which there is formed therefrom a series of hot carrier effect (HCE) resistant activated metal oxide semiconductor field effect transistors (MOSFETs). The second thermal annealing method employed a furnace annealing at exposure conditions of either: (1) 450 degrees centigrade for a time period of 60 minutes; (2) 750 degrees centigrade for a time period of about 60 minutes; or (3) 800 degrees centigrade for a time period of about 60 minutes. The furnace annealing method also employed: (1) a furnace pressure of about 760 torr; and (2) a furnace ambient of nitrogen at a flow rate of about 10 standard cubic centimeters per minute (sccm).

There was then measured for each of the metal oxide semiconductor field effect transistors (MOSFETs) the saturation drain current ($Id_{sat}$) as a function of environmental stress time within a stress environment at room temperature and a stress ambient atmosphere of nitrogen. The resulting data were then fitted through a log-log linear least squares regression analysis to equation 1:

$$Id_{sat} = a \times T^b \tag{1}$$

where T equals the stress time. The constants "a" and "b" were determined through the log-log linear least squares regression analysis of the data points.

Within metal oxide semiconductor field effect transistor (MOSFET) hot carrier effect (HCE) resistance determinations in accord with models employing equation 1, the intercept constant "a" is typically correlated with metal oxide semiconductor field effect transistor (MOSFET) hot carrier effect (HCE) resistance derived from factors other than those relating to the electric field gradient at the gate electrode edges within a metal oxide semiconductor field effect transistor (MOSFET) (where such other factors may include, but are not limited to gate dielectric layer/silicon substrate interfacial effects and gate dielectric layer bulk material effects). Similarly, the exponential constant "b" is typically correlated with metal oxide semiconductor field effect transistor (MOSFET) hot carrier effect (HCE) resistance derived from factors relating to the electric field gradient at gate electrode edges within the metal oxide semiconductor field effect transistor (MOSFET) (where such other factors may include, but are not limited to the presence, absence or doping levels of lightly doped drain (LDD) low dose ion implant structures, doubly doped drain (DDD) low dose ion implant structures, or similar ion implant structures adjoining the gate electrode edges).

Reported in Table I is a projected lifetime of each the three series of activated metal oxide semiconductor field effect transistors (MOSFETs) formed upon each of the three semiconductor substrates in accord with the above three sets of two step thermal annealing conditions. The projected lifetimes are determined through extrapolation to a time at which the drain saturation currents exceed of an arbitrary threshold value.

TABLE I

| Example | Annealing Conditions | Projected Lifetime |
|---|---|---|
| 1 | 925C RTA + 450C furnace | 0.59 years |
| 2 | 925C RTA + 750C furnace | 3.59 |
| 3 | 925C RTA + 800C furance | 2.14 |

From review of the data in Table I it is seen that the projected lifetime of a metal oxide semiconductor field effect transistor (MOSFET) under environmental stress with respect to hot carrier effect (HCE) resistance is significantly increased as a result of thermally annealing the semiconductor substrate upon which is formed the metal oxide semiconductor field effect transistor (MOSFET) in accord with the two step thermal annealing method of the preferred embodiment of the present invention in comparison with an otherwise equivalent two step thermal annealing method employing a substantially lower thermal annealing temperature within the second thermal annealing method of the two step thermal annealing method.

Although alternative rationalizations are not precluded, it is believed that the two step thermal annealing method of the present invention provides silicon oxide gate dielectric layer-silicon substrate properties and/or bulk silicon oxide gate dielectric layer properties which provide hot carrier effect (HCE) resistance within hot carrier effect (HCE) resistant activated metal oxide semiconductor field effect transistors (MOSFETs) formed through the two step thermal annealing method of the present invention.

As is understood by a person skilled in the art, the preferred embodiment and examples of the present invention are representative of the present invention rather than limiting of the present invention. Revisions and modifications may be made to methods, materials, structures and dimensions through which is formed a metal oxide semiconductor field effect transistor (MOSFET) in accord with the preferred embodiment and examples of the present invention while still providing embodiments and examples which are within the spirit and scope of the present invention.

What is claimed is:

1. A method for forming a metal oxide semiconductor field effect transistor (MOSFET) comprising:

providing a semiconductor substrate;

forming upon the semiconductor substrate a gate dielectric layer;

forming upon the gate dielectric layer a gate electrode;

implanting into the semiconductor substrate while employing at least the gate electrode as a mask a pair of unactivated source/drain regions at a pair of opposite edges of the gate electrode, where the gate dielectric layer, the gate electrode and the pair of unactivated source/drain regions comprise an unactivated metal oxide semiconductor field effect transistor (MOSFET);

annealing thermally, while employing a first thermal annealing method which employs a first thermal annealing temperature of from about 900 to about 950 degrees centigrade, the semiconductor substrate to form from the pair of unactivated source/drain regions a pair of activated source/drain regions, where the gate dielectric layer, the gate electrode and the pair of activated source/drain regions comprise an activated metal oxide semiconductor field effect transistor (MOSFET); and annealing thermally, while employing a subsequent second thermal annealing method which employs a second thermal annealing temperature of from about 750 to about 800 degrees centigrade, the semiconductor substrate to form from the activated metal oxide semiconductor field effect transistor (MOSFET) a hot carrier effect (HCE) resistant activated metal oxide semiconductor field effect transistor (MOSFET), where the hot carrier effect (HCE) resistant activated metal oxide semiconductor field effect transistor (MOSFET) has an enhanced hot carrier effect (HCE) resistance in comparison with the activated metal oxide semiconductor field effect transistor (MOSFET).

2. The method of claim 1 wherein the first thermal annealing method is a rapid thermal annealing (RTA) method undertaken for a first thermal annealing time period of from about 20 to about 30 seconds.

3. The method of claim 2 wherein the first thermal annealing method is undertaken in a nitrogen annealing ambient at a rapid thermal annealing (RTA) reactor pressure of about 760 torr.

4. The method of claim 2 wherein the second thermal annealing method is a conventional furnace annealing method undertaken for a second thermal annealing time period of from about 50 to about 60 minutes.

5. The method of claim 4 wherein the second thermal annealing method is undertaken in a nitrogen annealing ambient at a furnace pressure of about 760 torr.

* * * * *